United States Patent
Inoue

(10) Patent No.: US 7,923,699 B2
(45) Date of Patent: Apr. 12, 2011

(54) TRACKING CONTROL METHOD AND ELECTRON BEAM WRITING SYSTEM

(75) Inventor: Hideo Inoue, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 359 days.

(21) Appl. No.: 12/268,684

(22) Filed: Nov. 11, 2008

(65) Prior Publication Data
US 2009/0134343 A1 May 28, 2009

(30) Foreign Application Priority Data
Nov. 26, 2007 (JP) ................................ 2007-304096

(51) Int. Cl.
*H01J 3/26* (2006.01)
*H01J 7/00* (2006.01)

(52) U.S. Cl. ............. 250/398; 250/396 R; 250/396 ML; 250/397; 250/491.1; 250/492.1; 250/492.22

(58) Field of Classification Search ............. 250/396 R, 250/396 ML, 397, 398, 491.1, 492.1, 492.22
See application file for complete search history.

(56) References Cited

U.S. PATENT DOCUMENTS

| | | | | |
|---|---|---|---|---|
| 7,476,881 B2 * | 1/2009 | Hattori et al. | ............ | 250/492.22 |
| 7,589,335 B2 * | 9/2009 | Matsukawa et al. | ..... | 250/492.22 |
| 7,698,682 B2 * | 4/2010 | Anpo et al. | ...................... | 716/55 |
| 7,741,614 B2 * | 6/2010 | Inoue | ............................. | 250/400 |
| 2007/0023689 A1 * | 2/2007 | Iizuka et al. | ................ | 250/491.1 |
| 2008/0011965 A1 * | 1/2008 | Matsukawa et al. | .......... | 250/398 |
| 2008/0046787 A1 * | 2/2008 | Anpo et al. | ..................... | 714/701 |
| 2009/0057575 A1 * | 3/2009 | Oogi et al. | ............... | 250/492.22 |
| 2009/0084990 A1 * | 4/2009 | Nishimura et al. | ....... | 250/492.22 |
| 2009/0134343 A1 * | 5/2009 | Inoue | ....................... | 250/492.22 |
| 2009/0272911 A1 * | 11/2009 | Goshima | .................... | 250/396 R |
| 2009/0285494 A1 * | 11/2009 | Handa et al. | ................... | 382/218 |
| 2010/0030522 A1 * | 2/2010 | Tsuchiya et al. | ............... | 702/183 |
| 2010/0173235 A1 * | 7/2010 | Kato et al. | ....................... | 430/30 |
| 2010/0282956 A1 * | 11/2010 | Kimba et al. | ............... | 250/252.1 |
| 2010/0306721 A1 * | 12/2010 | Anpo | ............................... | 716/5 |
| 2010/0314560 A1 * | 12/2010 | Yabara | ........................ | 250/492.3 |

FOREIGN PATENT DOCUMENTS
JP 6-196394 7/1994
* cited by examiner

*Primary Examiner* — David A Vanore
(74) *Attorney, Agent, or Firm* — Oblon, Spivak, McClelland, Maier & Neustadt, L.L.P.

(57) ABSTRACT

Control data for a main deflector is calculated based on position data that specifies the position of a region to be irradiated with the electron beam on the subfield, data on the number of all beam shots on the subfield, data on a time required for all the beam shots, and stage data that specifies the position of the stage. When the number of beam shots on one of the divided subfield sections reaches the obtained number of the beam shots on each of the divided subfield sections, a writing process proceed to a writing operation to be performed on another one of the divided subfield sections based on the direction of the movement of the stage.

9 Claims, 4 Drawing Sheets

TRACKING CONTROL METHOD AND ELECTRON BEAM WRITING SYSTEM

BACKGROUND OF THE INVENTION

1. Field of the Invention

The present invention relates to a tracking control method in which a main deflector deflects an electron beam to ensure that a region in a subfield of a mask blank placed on the stage that continuously moves is irradiated with the electron beam in accordance with the movement of the stage and to an electron beam writing system having means for performing the tracking control method, and more particularly to a tracking control method and an electron beam writing system capable of avoiding an abnormality of tracking.

2. Background Art

In recent years, an electron beam writing apparatus has used a vector scanning method to improve the throughput of the apparatus. In the vector scanning method, an electron beam is deflected only to a region (on a mask blank) in which a pattern is to be written. Specifically, in the vector scanning method, a stage having the mask blank thereon is continuously moved, and tracking control is performed to ensure that a main deflector deflects the electron beam to irradiate with the beam a predetermined region in a subfield of the mask blank in accordance with the movement of the stage.

In this writing method, however, the relationship between the speed of the movement of the stage and the deflection range of the electron beam may be not appropriate. That is, an area irradiated with the electron beam deflected by a control system for the main deflector may deviate from the predetermined region, and the writing operation may be aborted for an abnormality.

Proposed heretofore is a tracking control method in which deflection data in accordance with the stage movement is input to a highly responsive sub deflector with a narrower deflection range than that of a main deflector, and the tracking control of an electron beam is performed at high speed and with high accuracy (refer to, for example, Japanese Patent Laid-Open No. 196394/1995 (Hei 06-196394) (claims 1 and 3)).

In the above case, since the sub deflector deflects the electron beam to a region smaller than a region to which the electron beam is deflected by the main deflector, there is a high possibility that an area to be irradiated with the deflected electron beam deviates from a desired region. To avoid this, a conventional electron beam writing apparatus has means for detecting the deviation. When the means detects that there is a possibility that the deviation occurs, a writing operation is temporarily stopped. The main deflector corrects a region to be irradiated with the electron beam and resets the region. The writing operation is then performed.

In the conventional tracking control method, however, there is a high possibility that the writing operation is stopped. As a result, the throughput of the electron beam writing apparatus is significantly reduced, and an operation for restarting the writing operation is required.

As another method for avoiding the abortion due to an abnormality of the writing operation, a method for the writing operation in which the speed of the movement of the stage is reduced has been proposed. When the speed of the movement of the stage is low, however, the throughput of the electron beam apparatus is also reduced. This is not compatible with the desired purpose of the vector scanning method.

As still another method for avoiding the abortion, the following method has been proposed: a method in which a subfield is divided into a plurality of sections, and the number of electron beam shots per subfield positioning operation is reduced.

In this method, it is necessary that a trial writing operation be performed to obtain an optimal number of divided sections before an actual writing operation.

FIG. 4 is a flowchart showing a writing process using the conventional method in which a subfield is divided into sections. In the writing process, shot data (Xm, Ym) that specifies the position (in X-Y coordinates) of a region to be irradiated with a beam is first read in step S'1 in order to perform a trial writing operation without a mask blank. Next, control data for controlling a main deflector is calculated based on the shot data in step S'2. In order to convert the control data into an analog signal, a digital-to-analog converter (DAC) is set in step S'3. After the time for settling a voltage to be applied to the main deflector elapses in step S'4, the trial writing operation (trial shot) is performed in step S'5. It is determined whether or not the number of divided subfield sections will cause abortion of a writing operation in step S'6. When the number of divided subfield sections is not optimal, that number is changed, and the above operations in steps S'1 to S'5 are performed again. When the number of divided sections is optimal, the writing process proceeds to an actual writing operation in step S'7.

In the actual writing operation, position data (Xm, Ym) that specifies the position (in the X-Y coordinates) of a region to be irradiated with a beam is read in step S'8. In addition, stage data that specifies the position (in the X-Y coordinates) of a moving stage is read in step S'9. When it is determined that the mask blank reaches a region in which a pattern can be written in step S'10, control data for controlling the main deflector is calculated based on the position data and the stage data in step S'11. In order to convert the control data into an analog signal, the DAC is set in step S'12. After the time for settling a voltage to be applied to the main deflector elapses in step S'13, a beam is shot in step S'14.

Then, the above operations in steps S'8 to S'14 are repeated until the entire subfield is irradiated with the beam in step S'15.

The above method for performing the trial writing operation involves complex steps and inconvenience in that the trial writing operation needs to be performed a plurality of times to find an optimal number of divided subfield sections.

During the tracking control time in the above method, a shot operation is not performed during the time period from the calculation of the control data for the main deflector, through the DAC setting, to the settling of the voltage to be applied to the main deflector. Therefore, the abortion may conceivably be avoided by reducing the time required for the above operations and thereby increasing the shot operation time.

However, the problem to be solved is not to cause discrepancies between the time period for the shot operation within a subfield and the speed at which the stage moves. When the shot density is remarkably high, the abortion may still occur even if the time period for the shot operation is increased. Thus, the above method also does not solve the problem essentially.

SUMMARY OF THE INVENTION

It is, therefore, an object of the present invention to provide a tracking control method in which an optimal subfield division number is reliably calculated to avoid abortion in real time in an actual beam shot process and to provide an electron beam writing system capable of performing the tracking control method.

According to one aspect of the present invention, in a tracking control method, positional data that specifies a position to be irradiated with an electron beam, the position being located in a subfield on a mask blank placed on a stage of an electron beam writing system, data on the number of all beam shots to be performed onto the subfield, and data on the time required for all the beam shots are read. Stage data that specifies a position of the stage is read at which tracking control needs to be performed for deflecting by a main deflector an electron beam shot toward the subfield on the mask blank while the stage is moved continuously, the deflection being such that the electron beam is deflected onto a desired position in the subfield on the mask blank placed the continuously moving stage. Control data for the main deflector is calculated based on the positional data and the stage data when the mask blank reaches a region in which a shot operation can be performed. The number of divided subfield sections by dividing the time required for all the beam shots by a time unit during which a shot operation can actually be performed in the subfield and the number of divided beam shots by dividing the number of all the beam shots by the number of divided subfield sections are calculated. A tracking operation is performed in which after voltage settlement for the main deflector, the number of beam shots is counted with the commencement of a shot operation for a divided subfield section and in which the shot operation is shifted to a next divided subfield section in accordance with the movement of the stage after the counted number of beam shots reaches the number of divided beam shots. Until the entire shot operations are performed for all the divided subfield sections, said steps of reading said stage data, calculating said control data, calculating said number of divided beam shots, and performing said tracking operation after voltage settlement for said main deflector are repeatedly performed in the mentioned order.

According to another aspect of the present invention, an electron beam writing system comprises tracking control means for deflecting by a main deflector an electron beam onto a subfield on a mask blank placed on a continuously moving stage. The tracking control means comprises storage means for storing in a correlated manner positional data that specifies a position in the subfield to be irradiated with an electron beam, data on the number of all beam shots to be performed onto the subfield, and data on the time required for all the beam shots; stage control means for controlling the speed at which the stage moves, measuring the position of the stage, and generating stage data that specifies the position of the stage; control data calculation means for calculating control data for the main deflector based on the positional data and the stage data after the mask blank reaches a region in which a shot operation can be performed; and division processing means for dividing the time required for all the beam shots by a time unit during which a shot operation can actually be performed in the subfield to obtain the number of divided subfield sections and for dividing the number of all the beam shots by the number of divided subfield sections to obtain the number of divided beam shots. The division processing means comprises tracking processing means for performing a tracking operation in which the tracking processing means counts, after voltage settlement for the main deflector, the number of beam shots with the commencement of a shot operation for a divided subfield section and in which the tracking processing means shifts the shot operation to a next divided subfield section in accordance with the movement of the stage after the counted number of beam shots reaches the number of divided beam shots.

DETAILED DESCRIPTION OF THE PREFERRED EMBODIMENTS

The tracking control in an electron beam writing apparatus is performed by constantly measuring the position of a moving stage in X-Y coordinates by means of a laser interferometer or the like, measuring the distance the stage has moved for the time period from the start of writing of a subfield to the completion of writing within the subfield, and correcting the position of the subfield so as to cancel a shift in shot coordinates caused by the movement of the stage. This correction is performed by controlling a voltage to be applied to a main deflector.

Figure 1:
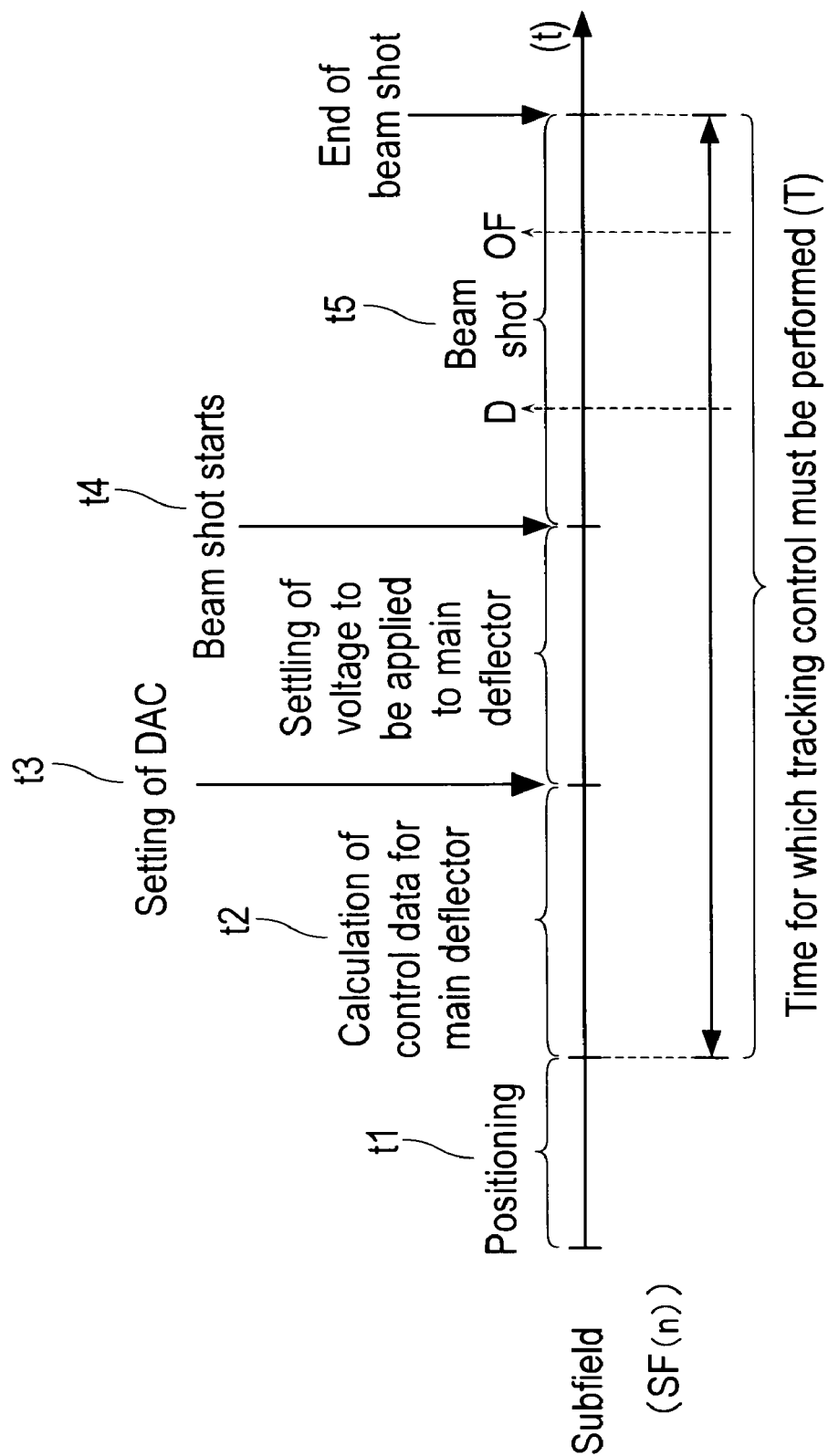
FIG. 1 is a time chart of tracking control for a given subfield.

FIG. 1 is a time chart of the tracking control for a given subfield.

First, the stage mounting a mask blank thereon moves. After the subfield to be subjected to the tracking control reaches a region in which a pattern can be written, the operation of positioning the subfield is performed for a time t1.

After the positioning, the operation of calculating control data for the main deflector is performed for a time t2 to allow the main deflector to deflect an electron beam for the tracking control.

In order to convert the control data to an analog signal, a digital-to-analog converter (DAC) is set at a time t3. After a time t4 for settling a voltage to be applied to the main deflector, an electron beam is shot for a predetermined time t5. A time period Ttrk during which the tracking control needs to be performed is represented by the following formula.

$$Ttrk = t2(Tcale) + t3(DACSET) + t4(Tset1) + t5(Tshot) \quad (1)$$

When a region to be tracked on the subfield (which is defined as a tracking distance) is represented by Txmax, and the speed of the stage is represented by Vx, the tracking time during which the stage moves is represented by formula (2).

$$Txmax/Vx \quad (2)$$

The relationship between the formulas (1) and (2) must satisfy the following expression.

$$Ttrk < Txmax/Vx \quad (3)$$

When an area irradiated with the electron beam deflected by a control system for the main deflector deviates from a predetermined region before the end of the shot time t5, overflow may occur before the end of the beam shot, and the writing operation may be aborted due to the overflow. In this case, the shot time t5 can be increased by reducing the time t2 for calculating the control data for the main deflector and the time t4 for settling the voltage to be applied to the main deflector.

However, the formula (3) must be satisfied as a prerequisite in order to perform the tracking control. When the shot density is remarkably high, the writing operation may be aborted even when the times t2 and t4 are reduced.

To avoid the abortion, the subfield is divided at a time D before the time point OF of the overflow. In the tracking control method according to the present invention, the time point of the overflow is calculated in advance, and an optimal time point of the division of the subfield is obtained.

Figure 2:
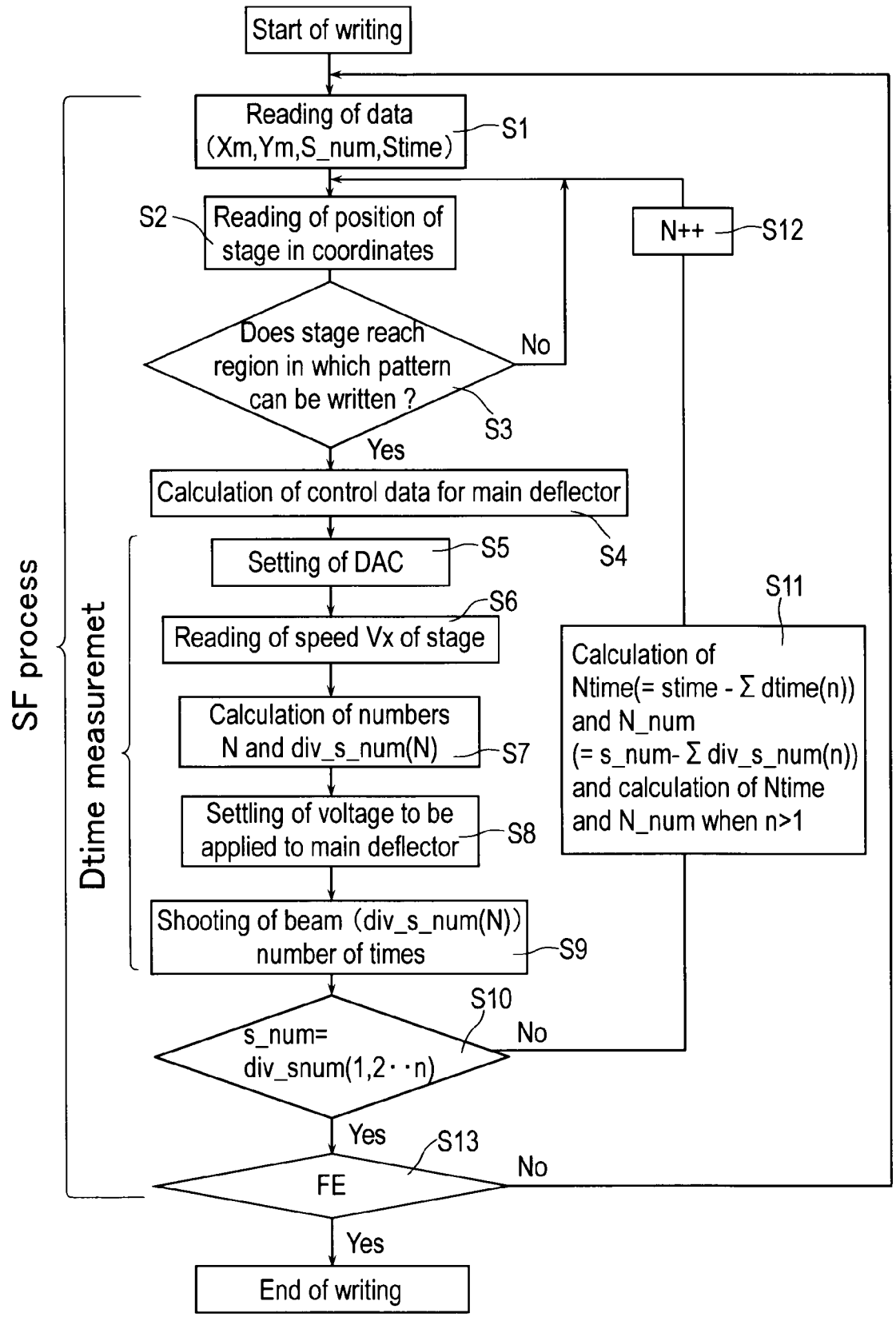
FIG. 2 is a flowchart of a tracking control method according to the present invention.

FIG. 2 is a flowchart showing the tracking control method according to the present invention.

When the writing operation in a given subfield is started, the following data is read in step S1: position data (Xm, Ym) that specifies the position of a region irradiated with an electron beam in X-Y coordinates; data (s_num) on the total number of beam shots on the subfield; and a time required for all the beam shots.

In the conventional tracking control method in which a trial writing operation is performed, only position data is used. In contrast, in the tracking control according to the present invention, the total number of beam shots on a subfield and the time required for all the beam shots are used in addition to the position data in order to divide the subfield as explained in FIG. 1.

Next, stage data that specifies the position of the moving stage in the X-Y coordinates is read in step S2. Since the stage continuously moves, the position of the stage is constantly measured by means of a laser interferometer or the like.

The stage data is sequentially read to determine whether or not the stage reaches a region in which a pattern can be written in step S3. When the stage reaches the region in which a pattern can be written, control data for the main deflector is calculated based on the position data and the stage data in step S4. In order to convert the control data into an analog signal, the DAC is then set in step S5. The main deflector is capable of deflecting the electron beam based on the calculated control data such that a desired region in the subfield is irradiated with the electron beam in accordance with the movement of the stage.

The stage speed Vx is read in step S6. The subfield division number (N) and the number of beam shots on each of the divided subfield sections (div_s_num (N)) are calculated in step S7.

The subfield division number (N) is calculated by dividing the time required for all the beam shots (stime) by time units during which a shot operation can actually be performed on the subfield.

The time during which a shot operation can actually be performed can be calculated by subtracting the time for calculating the control data for the main deflector (Tcalc) and the time for settling the voltage to be applied to the main deflector (Tset1) from the time Txmax/Vx (represented by formula (2)) during which the stage moves for the tracking control. The subfield division number (N) is therefore represented by formula (4).

$$N = stime / ((Txmax/Vx) - (Tcalc + Tset1)) \quad (4)$$

In this case, when the division number (N) has a fraction, the division number (N) is rounded up to the next whole number: the division number (N) becomes N+1.

The divided shot number (div_s_num (N)) is calculated by dividing the number of all the beam shots (s_num) by the subfield division number (N) as represented by the following formula (5).

$$(div\_s\_num(N)) = (s\_num)/N \quad (5)$$

After a voltage to be applied to the main deflector settles in step S8, an electron beam is shot up to the divided shot number (div_s_num (N)) in step S9. The number of the beam shots is counted by a shot counter (not shown).

In the case where the speed of the stage movement is constant, when the counted number of the beam shots reaches the divided shot number, an end flag (not shown) for the divided subfield section is set. Tracking is then performed to cause the writing process to proceed to the next writing operation to be performed on another one of the divided subfield sections based on the direction of the movement of the stage. The operations in step S2 to S9 are repeated until the writing operation is repeated up to the subfield division number. The writing operation on this subfield is then ended in step S13.

In the case where the speed of the stage movement is variable, after the operation in step S9 is performed on the first divided subfield section, the total number of completed beam shots (div_s_num (n)) is obtained. It is then determined whether or not the total number of the completed beam shots is equal to the number of all the beam shots (s_num) in step S10.

When the total number of the completed beam shots is not equal to the number of all the beam shots (s_num) (or when s_num>Σ div_s_num (n)), the time required for remaining beam shots (Ntime) and the number of the remaining beam shots (N_num) are calculated based on formulas (6) and (7), respectively, in step S11.

$$Ntime = stime - \Sigma dtime(n) \quad (6)$$

(where dtime (n) represents the time required for beam shots on a divided subfield section)

$$N\_num = s\_num - \Sigma div\_s\_num(n) \quad (7)$$

The operations in steps S2 to S9 are performed on the subsequent divided subfield section by means of values calculated based on formulas (6) and (7) in step S12. After that, the operations in steps S2 to S12 are subsequently performed. When the value s_num is equal to the value Σ div_s_num (n) in step S10, the writing process on the subfield is ended in step S13.

Figure 3:
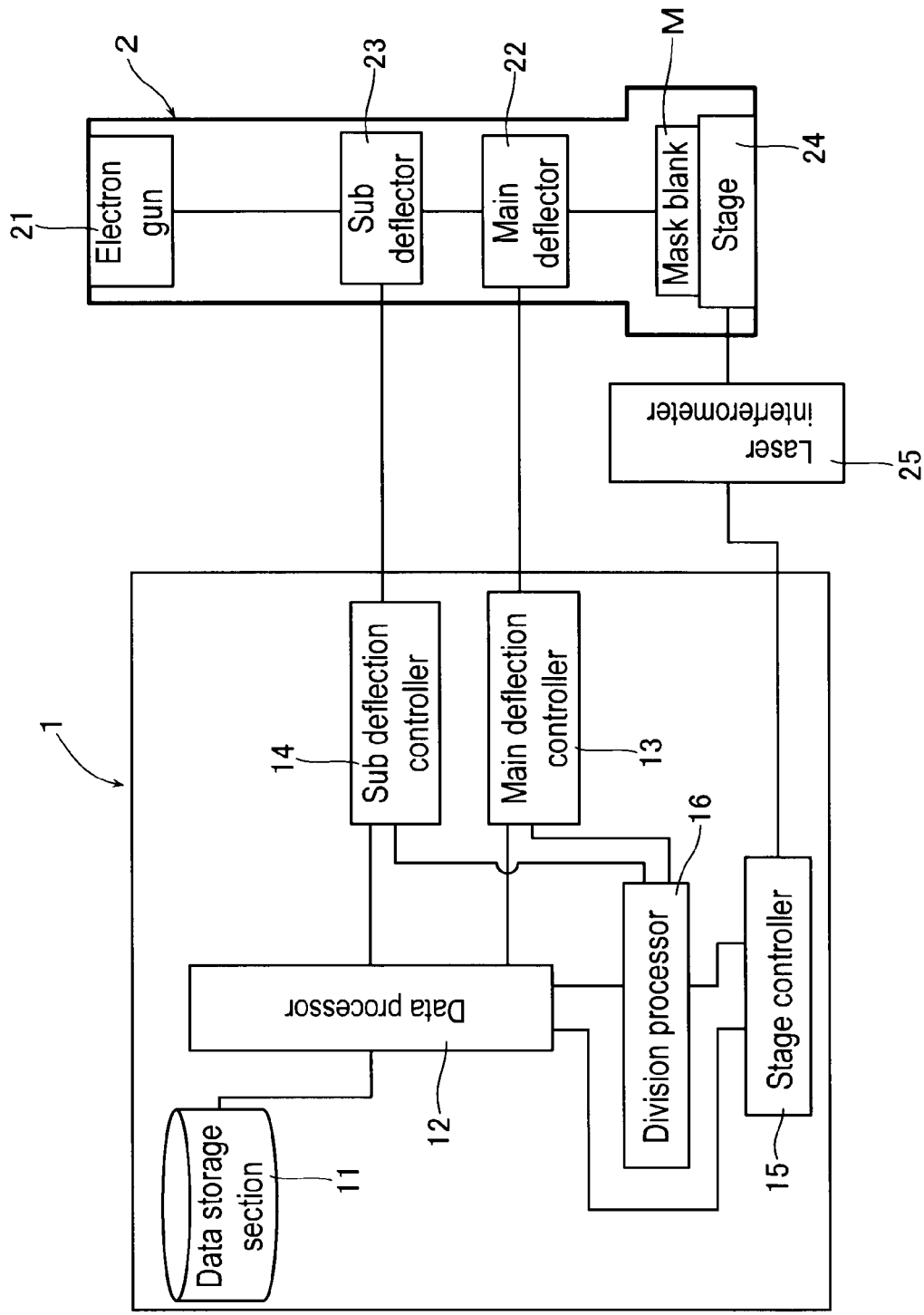
FIG. 3 is a block diagram showing the configuration of an electron beam writing system having a tracking control unit according to the present invention.
Figure 4:
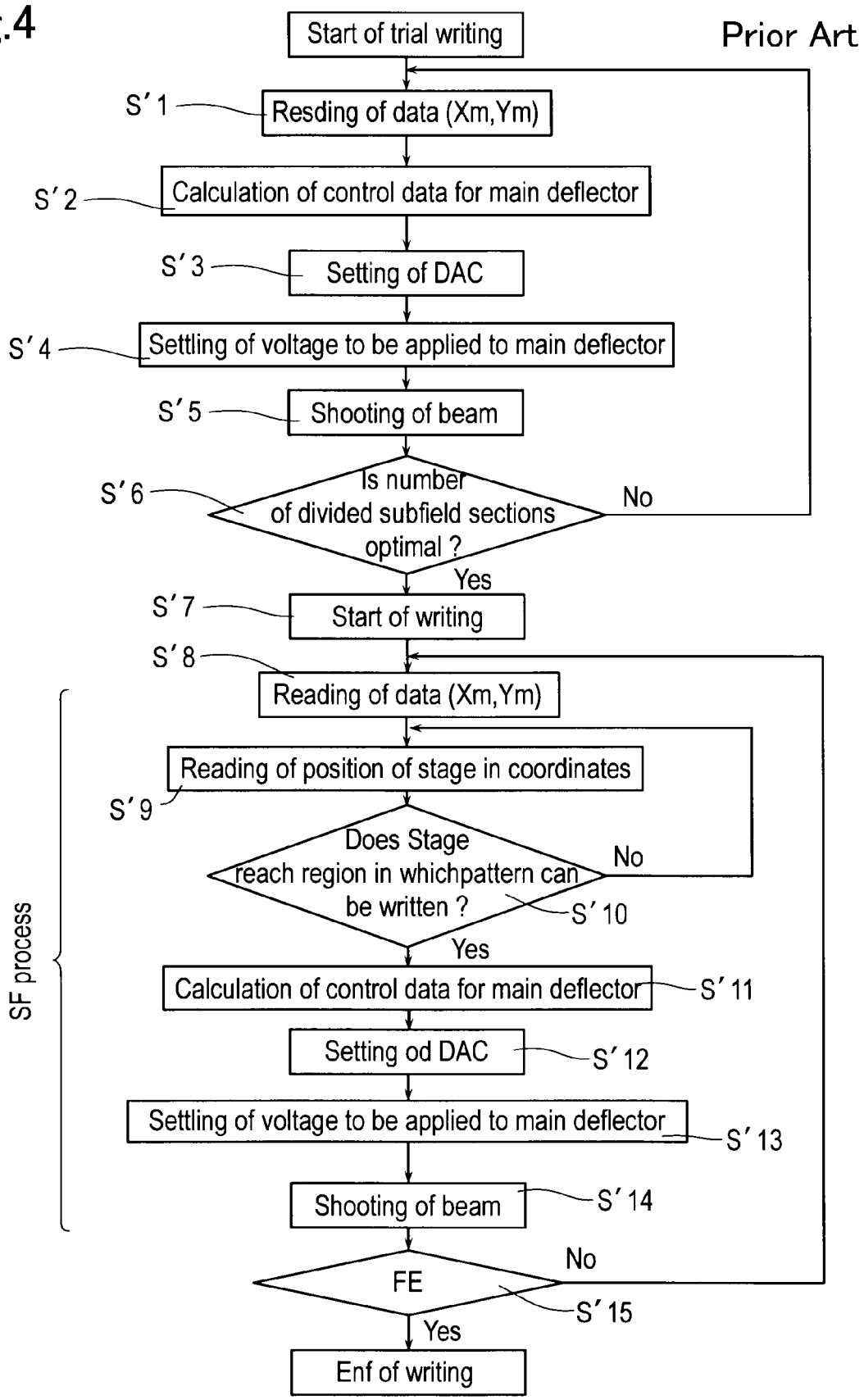
FIG. 4 is a flowchart showing a conventional tracking control method.

Referring to FIG. 3, reference numeral 1 denotes a tracking controller provided in an electron beam writing system according to the present invention. The tracking controller 1 is operable to ensure that a region in a subfield of a mask blank M placed on a stage 24 is irradiated with an electron beam emitted from an electron gun 21 provided in an electron beam writing apparatus 2 in accordance with a movement of the stage 24 that continuously moves.

The tracking control is performed on the subfield of the mask blank M placed on the stage 24.

The tracking controller 1 has a data storage section 11 for storing data including: position data that specifies the position of a region to be irradiated with an electron beam; data on the number of all beam shots on the subfield; and data on a time required for all the beam shots. The position data, the data on the number of all the beam shots on the subfield, and the data on the time required for all the beam shots are associated with each other.

Data on a predetermined subfield is read out from the data storage section 11 by a data processor 12.

The speed of the stage that continuously moves is controlled by a stage controller 15. The position of the stage 24 is constantly measured by a laser interferometer 25 and specified by means of XY coordinates data. The position of the stage 24 is read out by the stage controller 15 as stage data. The stage controller 15 transfers the stage data to the data processor 12.

When the mask blank M reaches a region in which a pattern can be written, a sub deflection controller 14 and a main deflection controller 15 respectively calculate control data for a sub deflector 23 and control data for a main deflector 22 based on the position data read by the data processor 12 and the stage data transferred to the data processor 12. The sub deflector 23 and the main deflector 22 are provided in the electron beam writing apparatus 2.

The main deflection controller 13 causes a digital-to-analog converter (DAC) to convert the calculated control data into an analog signal. The main deflection controller 13 causes a main deflector amplifier to control the behavior of the main deflector 22. The electron beam writing system is therefore capable of correcting the position of the subfield by means of the control of the behavior of the main deflector 22 to cancel a shift (caused by the movement of the stage) of a region to be irradiated with an electron beam. Specifically, the correction is performed by controlling a voltage to be applied to the main deflector.

The sub deflection controller 14 controls the behavior of the sub deflector 23. The sub deflector 23 controls the position of a spot of the electron beam on the subfield for each beam shot at high speed and with high precision.

The tracking controller 1 includes a division processor 16. The division processor 16 divides the time required for all beam shots (which is included in the data read out by the data controller 12) into time units for which an electron beam can be actually irradiated on the subfield, to calculate the number of divided subfield sections. The division processor 16 also divides the number of all the beam shots by the number of the divided subfield sections to obtain the number of the beam shots on each of the divided subfield sections.

In the electron beam writing system according to the present invention, after the time for settling the voltage to be applied to the main deflector elapses, an electron beam is irradiated on one of the divided subfield sections by means of the division processor 16. After the irradiation of the electron beam on the one of the divided subfield sections, the electron beam writing system performs tracking to cause the writing process to proceed to the writing operation to be performed on another one of the divided subfield sections based on the direction of the movement of the stage.

The features and advantages of the present invention may be summarized as follows.

As is obvious from the above explanation, the tracking control method and the electron beam writing system capable of performing the tracking control method, which relate to the present invention, are capable of calculating an optimal number of subfield sections, obtained by dividing a subfield, to avoid abortion in real time in an actual beam shot process.

In some conventional techniques, a trial writing operation needs to be performed a plurality of times to obtain an optimal subfield division number. In contrast, in the tracking control method and the electron beam writing system capable of performing the tracking control method according to the present invention, a subfield division operation is performed one time to reliably obtain an optimal number of subfield sections.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-304096, filed on Nov. 26, 2007 including specification, claims, drawings and summary, on which the Convention priority of the present application is based, are incorporated herein by reference in its entirety.

What is claimed is:

1. A tracking control method comprising the steps of:
   reading positional data that specifies a position to be irradiated with an electron beam, said position being located in a subfield on a mask blank placed on a stage of an electron beam writing system, data on the number of all beam shots to be performed onto said subfield, and data on the time required for all the beam shots;
   reading stage data that specifies a position of said stage at which tracking control needs to be performed for deflecting by a main deflector an electron beam shot toward said subfield on said mask blank while said stage is moved continuously, the deflection being such that said electron beam is deflected onto a desired position in said subfield on said mask blank placed said continuously moving stage;
   calculating control data for said main deflector based on said positional data and said stage data when said mask blank reaches a region in which a shot operation can be performed;
   calculating the number of divided subfield sections by dividing said time required for all the beam shots by a time unit during which a shot operation can actually be performed in said subfield and the number of divided beam shots by dividing said number of all the beam shots by said number of divided subfield sections; and
   performing a tracking operation in which after voltage settlement for said main deflector, the number of beam shots is counted with the commencement of a shot operation for a divided subfield section and in which said shot operation is shifted to a next divided subfield section in accordance with the movement of said stage after said counted number of beam shots reaches said number of divided beam shots, wherein
   until the entire shot operations are performed for all the divided subfield sections, said steps of reading said stage data, calculating said control data, calculating said number of divided beam shots, and performing said tracking operation after voltage settlement for said main deflector are repeatedly performed in the mentioned order.

2. The tracking control method according to claim 1 wherein
   upon calculation of said number of divided subfield sections, said number of divided subfield section is rounded up to the nearest whole number if said number of divided subfield sections has a fraction.

3. The tracking control method according to claim 1 wherein
   read after the shot operations for a first divided subfield section of the divided subfield sections are:
   in lieu of data on said number of all the beam shots, data on the number of the remaining shots obtained by subtracting from said number of all the beam shots the sum of the numbers of shots completed for divided subfield sections for which said tracking operation has been completed; and
   in lieu of data on said time required for all the beam shots, data on the time required for the remaining shots obtained by subtracting from said time required for all the beam shots the sum of the times taken by shots onto said divided subfield sections for which said tracking operation has been completed,
   said data on the number of the remaining shots and said data on the time required for the remaining shots being read so that the number of divided subfield sections and the number of beam shots can be recalculated for a subsequent divided subfield section with the use of said data on the number of the remaining shots, said data on the time required for the remaining shots, and the speed at which said stage moved when said subsequent divided subfield section reached a region in which a shot operation can be preformed.

4. The tracking control method according to claim 1 wherein
said time unit during which a shot operation can actually be performed in said subfield is obtained by first reading the speed of the stage movement when said mask blank reached a region in which a shot operation can be performed and dividing the distance of said subfield by said speed of the stage movement to calculate a stage movement time and then by subtracting from said stage movement time the calculation time for said control data and the voltage settlement time for said main deflector.

5. The tracking control method according to claim 2 wherein
upon calculation of said number of divided subfield sections, said number of divided subfield section is rounded up to the nearest whole number if said number of divided subfield sections has a fraction.

6. The tracking control method according to claim 2 wherein
read after the shot operations for a first divided subfield section of the divided subfield sections are:
in lieu of data on said number of all the beam shots, data on the number of the remaining shots obtained by subtracting from said number of all the beam shots the sum of the numbers of shots completed for divided subfield sections for which said tracking operation has been completed; and
in lieu of data on said time required for all the beam shots, data on the time required for the remaining shots obtained by subtracting from said time required for all the beam shots the sum of the times taken by shots onto said divided subfield sections for which said tracking operation has been completed,
said data on the number of the remaining shots and said data on the time required for the remaining shots being read so that the number of divided subfield sections and the number of beam shots can be recalculated for a subsequent divided subfield section with the use of said data on the number of the remaining shots, said data on the time required for the remaining shots, and the speed at which said stage moved when said subsequent divided subfield section reached a region in which a shot operation can be performed.

7. An electron beam writing system comprising tracking control means for deflecting by a main deflector an electron beam onto a subfield on a mask blank placed on a continuously moving stage, said tracking control means comprising:
storage means for storing in a correlated manner positional data that specifies a position in said subfield to be irradiated with an electron beam, data on the number of all beam shots to be performed onto said subfield, and data on the time required for all the beam shots;
stage control means for controlling the speed at which said stage moves, measuring the position of said stage, and generating stage data that specifies said position of said stage;
control data calculation means for calculating control data for said main deflector based on said positional data and said stage data after said mask blank reaches a region in which a shot operation can be performed; and
division processing means for dividing said time required for all the beam shots by a time unit during which a shot operation can actually be performed in said subfield to obtain the number of divided subfield sections and for dividing said number of all the beam shots by said number of divided subfield sections to obtain the number of divided beam shots, wherein
said division processing means comprises tracking processing means for performing a tracking operation in which said tracking processing means counts, after voltage settlement for said main deflector, the number of beam shots with the commencement of a shot operation for a divided subfield section and in which said tracking processing means shifts said shot operation to a next divided subfield section in accordance with the movement of said stage after the counted number of beam shots reaches said number of divided beam shots.

8. The electron beam writing system according to claim 7 wherein
said division processing means is designed to read after the completion of the shot operations for a first subfield section of said divided subfield:
data on the number of the remaining shots, said number being obtained by subtracting from said number of all the beam shots the sum of the numbers of shots completed for divided subfield sections for which said tracking operation has been completed; and
data on the time required for the remaining shots, said time being obtained by subtracting from said time required for all the beam shots the sum of the times taken by shots onto said divided subfield sections for which said tracking operation has been completed,
said data on the number of the remaining shots and said data on the time required for the remaining shots being read in order that said division processing means recalculates for a subsequent subfield section of the divided subfield the number of divided subfield sections and the number of beam shots with the use of said data on the number of the remaining shots, said data on the time required for the remaining shots, and the speed at which said stage moved when said subsequent subfield section reached a region in which a shot operation can be performed.

9. The electron beam writing system according to claim 7 wherein
said division processing means is designed to round up, upon calculation of said number of divided subfield sections, said number of divided subfield sections to the nearest whole number if said number of divided subfield sections has a fraction and also designed to read after the completion of the shot operations for a first subfield section of said divided subfield:
data on the number of the remaining shots, said number being obtained by subtracting from said number of all the beam shots the sum of the numbers of shots completed for divided subfield sections for which said tracking operation has been completed; and
data on the time required for the remaining shots, said time being obtained by subtracting from said time required for all the beam shots the sum of the times taken by shots onto said divided subfield sections for which said tracking operation has been completed,
said data on the number of the remaining shots and said data on the time required for the remaining shots being read in order that said division processing means recalculates for a subsequent subfield section of the divided subfield the number of divided subfield sections and the number of beam shots with the use of said data on the number of the remaining shots, said data on the time required for the remaining shots, and the speed at which said stage moved when said subsequent subfield section reached a region in which a shot operation can be performed.

* * * * *